US009389283B2

(12) United States Patent
Putinier

(10) Patent No.: US 9,389,283 B2
(45) Date of Patent: Jul. 12, 2016

(54) SYSTEM AND METHOD FOR CONVERTING OUTPUT OF SENSORS TO ABSOLUTE ANGULAR POSITION OF A ROTATING MEMBER

(71) Applicant: BEI Sensors & Systems Company, Inc., Moorpark, CA (US)

(72) Inventor: Rene Putinier, Chino Hills, CA (US)

(73) Assignee: Sensata Technologies, Inc., Attleboro, MA (US)

( * ) Notice: Subject to any disclaimer, the term of this patent is extended or adjusted under 35 U.S.C. 154(b) by 206 days.

(21) Appl. No.: 13/951,858

(22) Filed: Jul. 26, 2013

(65) Prior Publication Data

US 2015/0028856 A1    Jan. 29, 2015

(51) Int. Cl.
*G01R 33/07*    (2006.01)
*G01D 5/14*    (2006.01)

(52) U.S. Cl.
CPC ............... *G01R 33/07* (2013.01); *G01D 5/145* (2013.01)

(58) Field of Classification Search
CPC ............................ G01R 33/0094; G01R 33/07
See application file for complete search history.

(56) References Cited

U.S. PATENT DOCUMENTS

| 3,500,203 | A | 3/1970 | Waterloo |
| 4,658,742 | A | 4/1987 | Tanasescu et al. |
| 5,930,905 | A * | 8/1999 | Zabler ............... G01D 5/04 33/1 PT |
| RE36,341 | E | 10/1999 | Howell |
| 6,791,219 | B1 * | 9/2004 | Eric ............... H02K 11/0021 310/68 B |
| 7,137,347 | B2 * | 11/2006 | Wong et al. ............ 114/144 RE |
| 7,154,263 | B2 | 12/2006 | Hatano |
| 8,378,666 | B2 | 2/2013 | Putinier |
| 8,890,514 | B2 * | 11/2014 | Masson ............... B62D 6/10 324/207.21 |
| 2003/0227287 | A1 | 12/2003 | Hori et al. |
| 2007/0103147 | A1 | 5/2007 | Kondo et al. |
| 2007/0132449 | A1 | 6/2007 | Madni et al. |

(Continued)

FOREIGN PATENT DOCUMENTS

| DE | 102011078597 | * | 1/2013 | ......... B62D 15/0215 |
| DE | 102011078597 A1 | | 1/2013 | |

(Continued)

OTHER PUBLICATIONS www.novotechnik com/papers/papers-pdf/MultiturnWhitePaperV4. pdf; Novotechnik, "How to Substantially Reduce Encoder Cost While Gaining Functionality with Multi-Turn Rotary Position Sensors", retrieved from Internet Apr. 28, 2009.

(Continued)

*Primary Examiner* — Tung X Nguyen
*Assistant Examiner* — Alesa Allgood
(74) *Attorney, Agent, or Firm* — Banner & Witcoff, Ltd.

(57) ABSTRACT

A sensor system determines an absolute angular position of a to-be-sensed rotating member. The sensor system may include a rotor with a first magnet coupled to the rotor and a shaft having threads thereon. The sensor system may further include a sleeve with a second magnet and threads complementary to the threads of a shaft. The sleeve may be configured to travel axially along the shaft as a function of rotation of the rotor. The sensor system may also include a first transducer configured to sense orientation of the first magnet and at least one second transducer configured to sense a location of the second magnet along the shaft. Through use of the sensor system, an absolute number of turns and, consequently absolute angular position, of the rotating member can be determined.

18 Claims, 19 Drawing Sheets

(56) References Cited

U.S. PATENT DOCUMENTS

| | | | |
|---|---|---|---|
| 2009/0046256 A1 | 2/2009 | Chang et al. | |
| 2010/0289486 A1* | 11/2010 | Ehlebrecht et al. | ...... 324/207.25 |
| 2013/0015844 A1 | 1/2013 | Bogos et al. | |
| 2013/0274973 A1 | 10/2013 | Kamara et al. | |

FOREIGN PATENT DOCUMENTS

| | | | | |
|---|---|---|---|---|
| EP | 0272544 | * | 6/1988 | ............ B60C 23/061 |
| EP | 0272544 A1 | | 6/1988 | |
| EP | 1637843 | * | 3/2006 | ............... G01D 5/04 |
| EP | 1637843 A1 | | 3/2006 | |
| JP | 2006 234573 | | 9/2006 | |
| JP | 2007 322358 | | 12/2007 | |
| KR | 100888242 | | 3/2009 | |
| KR | 100911060 | | 8/2009 | |
| WO | 2006/087627 | * | 8/2006 | ......... B62D 15/0215 |
| WO | 2006/087627 A1 | | 8/2006 | |

OTHER PUBLICATIONS www.novotechnik.de/uploads/tx_extprodfind/RSM2800_analog_e.pdf; Novotechnick, "Novoturn Multiturn Sensor non-contacting" retrieved from Internet May 16, 2011.

http://www.melexis.com/Hall-Effect-Sensor-ICs/Triaxis%C2%AE-Hall-ICs/MLX90316-566.aspx "Mononlithic Programmable Triaxis Rotary Position Sensor IC", retrieved from Internet Apr. 10, 2013.

Nov. 13, 2014—(WO) International Search Report—App PCT/US2014/048425.

\* cited by examiner

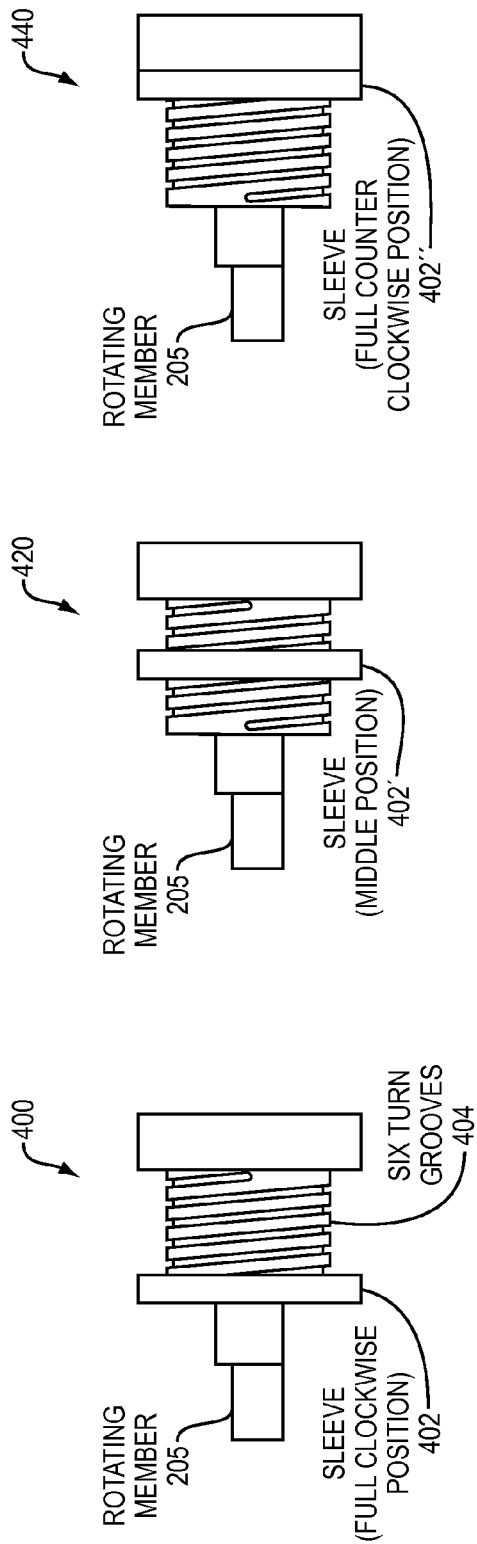
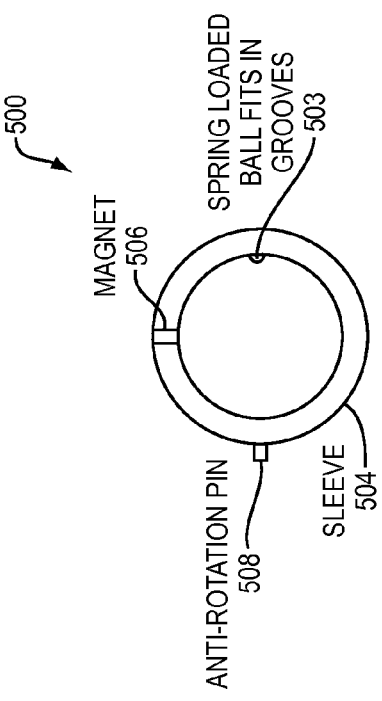

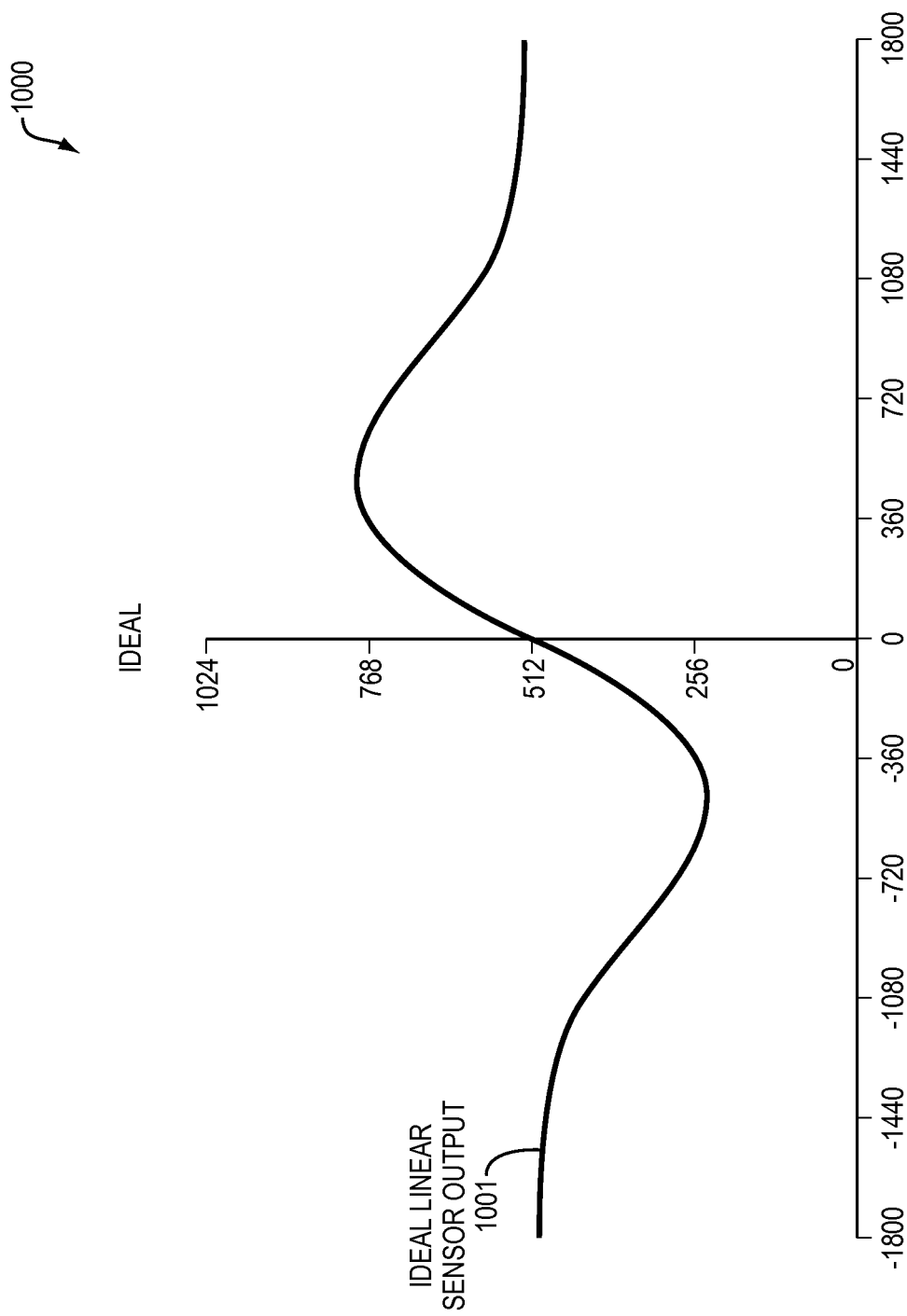

SYSTEM AND METHOD FOR CONVERTING OUTPUT OF SENSORS TO ABSOLUTE ANGULAR POSITION OF A ROTATING MEMBER

RELATED APPLICATION

This application is related to "System And Method For Determining Absolute Angular Position Of A Rotating Member" co-filed with this application on Jul. 26, 2013 to a common assignee, given U.S. patent application Ser. No. 13/951,847, and by Rene Putinier. This application is hereby incorporated by reference in its entirety.

BACKGROUND

A Hall effect sensor is a sensor that varies its output in response to a magnetic field. A Hall effect sensor can be used to determine an angular position of a rotating member. For such a use, Hall effect sensors generally output an angular position of a rotating member. For example, the output of a Hall effect sensor can be 0-360 degrees, or $0\text{-}2\pi$ radians.

SUMMARY

In one embodiment, a sensor can determine an absolute angular position of a to-be-sensed rotating member. The sensor includes a sensor rotor configured to rotate as a function of rotation of the rotating member. The sensor rotor includes a first magnet coupled to the sensor rotor and a shaft having threads thereon. The sensor further includes a sleeve, which includes a second magnet and threads complementary to the threads of the shaft. The sleeve is configured to travel axially along the shaft as a function of rotation of the sensor rotor. The sensor also includes a first transducer configured to sense orientation of the first magnet. The sensor further includes at least one second transducer configured to sense a location of the second magnet along the shaft.

In another embodiment, the sensor includes a complimentary retaining pair configured to cause the sleeve to travel axially along the shaft as a function of rotation of the sensor rotor.

In a further embodiment, the first transducer or the second transducer can be a Hall effect transducer, an optical transducer, a resistive transducer, or an inductive transducer.

In yet a further embodiment, the sensor can further include a magnetic shield positioned between the first magnet and the second magnet.

In another embodiment, the at least one second transducer can include a plurality of transducers. The number of transducers can be a function of a number of sensor rotor turns the sensor can count. The transducers can include six transducers, and the number of turns the sensor can count can be ten, for example.

In another embodiment, the sensor can include a processor configured to convert output from the first transducer and at least one second transducers to a representation of an absolute angular position of the rotating member.

In another embodiment, the sleeve can be coupled with a stopping bearing configured to hold the sleeve in association with the threads of the shaft in event of a runout to enable the sleeve to be reassociated with the shaft responsive to reverse turning of the sensor rotor. A spring-loaded ball assembly is an example of a stopping bearing.

In yet a further embodiment, the at least one second transducer can be mounted on a printed circuit board. The printed circuit board may be a daughter printed circuit board that is mounted to a mother circuit board at a perpendicular or other angle. The first transducer can be coupled to the mother circuit board.

In another embodiment, a method for determining absolute angular position of a rotating member with a sensor can include rotating a sensor rotor as a function of rotation of the to-be-sensed rotating member. The sensor rotor can include a first magnet coupled to the sensor rotor and a shaft having threads thereon. The method can further include travelling axially a sleeve along the shaft as a function of rotation of the sensor rotor. The sleeve can include a second magnet and threads complementary to the threads of the shaft. The method can additionally include sensing orientation of the first magnet at a first transducer. The method can further include sensing location of the second magnet along the shaft at at least one second transducer.

In one embodiment, a method of determining an absolute angular position of a rotating member includes determining, based on outputs of a plurality of sensors, at least one sensor of the plurality of sensors. The method further includes calculating the absolute angular position based on an output of the determined at least one sensor, and an angular position of the rotating member.

In another embodiment, determining the at least one sensor can include determining a sensor of the plurality of sensors with the highest output and determining the at least one sensor based on their location relative to the sensor.

In yet another embodiment, calculating the absolute angular position can further include calculating a first difference of a first output of a first sensor of the determined at least one sensor and a second output of a second sensor of the determined at least one sensor, generating a cutoff value based on a second difference of the first difference and a ratio of the angular position of the rotating member, generating a turn number based on the cutoff value, the at least one sensor, and the angular position of the rotating member, and returning an output value based on an output difference of a multiple of the turn value from the angular position of the rotating member.

In another embodiment, calculating the turn value can include comparing the cutoff value to at least one range cutoff, determining a corresponding range thereof, and based on the range, calculating the turn value. Calculating the turn value can be based on a location of a sensor with the highest output relative to the plurality of sensors. The multiple of the turn value can be 4096.

In another embodiment, the output value can represent the absolute angular rotation and the angular rotation of the rotating member.

In yet another embodiment, the method can include adding a constant to the difference.

In a further embodiment, the plurality of sensors can include six sensors.

The method can be performed on at least one of a field programmable gate array (FPGA), processor, and look up table (LUT).

In one embodiment, a system for determining an absolute angular position of a rotating member includes a sensor selection module configured to determine, based on outputs of a plurality of sensors, at least one sensor of the plurality of sensors. The system further includes a calculation module configured to calculate the absolute angular position based on an output of the determined at least one sensor, and an angular position of the rotating member.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIG. 4A is a block diagram illustrating an example embodiment of the rotating member with a sleeve in a full clockwise position.

FIG. 4B is a block diagram illustrating an example embodiment of the rotating member with a sleeve in a middle position.

FIG. 4C is a block diagram illustrating another example embodiment of the rotating member with a sleeve.

FIG. 5 is a block diagram illustrating an example embodiment of a sleeve.

FIG. 10A is a graph illustrating an example embodiment of an ideal linear sensor output.

DETAILED DESCRIPTION

A description of example embodiments of the invention follows.

Figure 1:
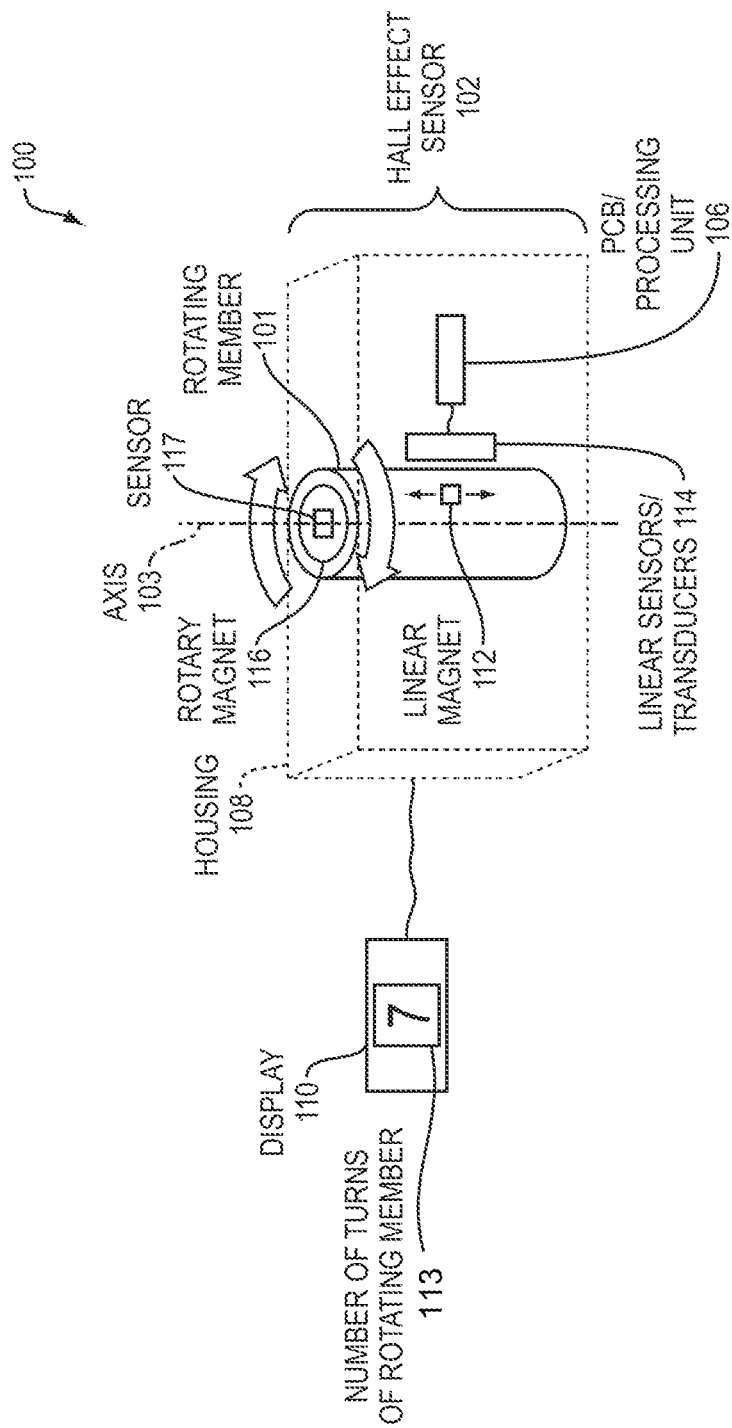
FIG. 1 is a block diagram illustrating an example embodiment of a Hall effect sensor employed by the present invention.

FIG. 1 is a block diagram 100 illustrating an example embodiment of a Hall effect sensor 102 employed by an embodiment the present invention. A Hall effect sensor 102 includes a rotating member 101 configured to rotate along an axis. The rotating member 101 is enclosed in a housing 108. The housing also includes at least one transducer 114 that is connected to a printed circuit board (PCB) or processing unit 106. The Hall effect sensor 102 also includes a magnet positioned such that the at least one transducer 114 can detect whether the rotating member 101 has made a turn. The rotating member 101 can turn either clockwise or counterclockwise. In a traditional Hall effect sensor 102 arrangement, the sensor can determine angular rotation of the rotating member 101 but cannot, however, determine a number of turns the rotating member 101 has made.

In the Hall effect sensor 102 arrangement employed by the embodiment of the present invention of FIG. 1, multiple linear sensors/transducers 114 determine the location of a linear magnet 112 configured to traverse axially, along an axis 103 of the rotating member 101 coupled with a rotary magnet 116 and sensor 117. The printed circuit board (PCB) 106, based on the information from the transducers 114, determines the number of turns 113 made by the rotating member 101. The Hall effect sensor 102 can then output the number of turns, for example, to a display 110 that shows the number of turns made by the rotating member 101. The Hall effect sensor 102, or a transmitter (not shown) operationally connected to an output thereof, can alternately transmit a representation of the number of turns via a wired, wireless, or optical communications medium, to a device, e.g., computer, server, handheld device, configured to receive and process the representation in a way understood in the art.

Figure 2:
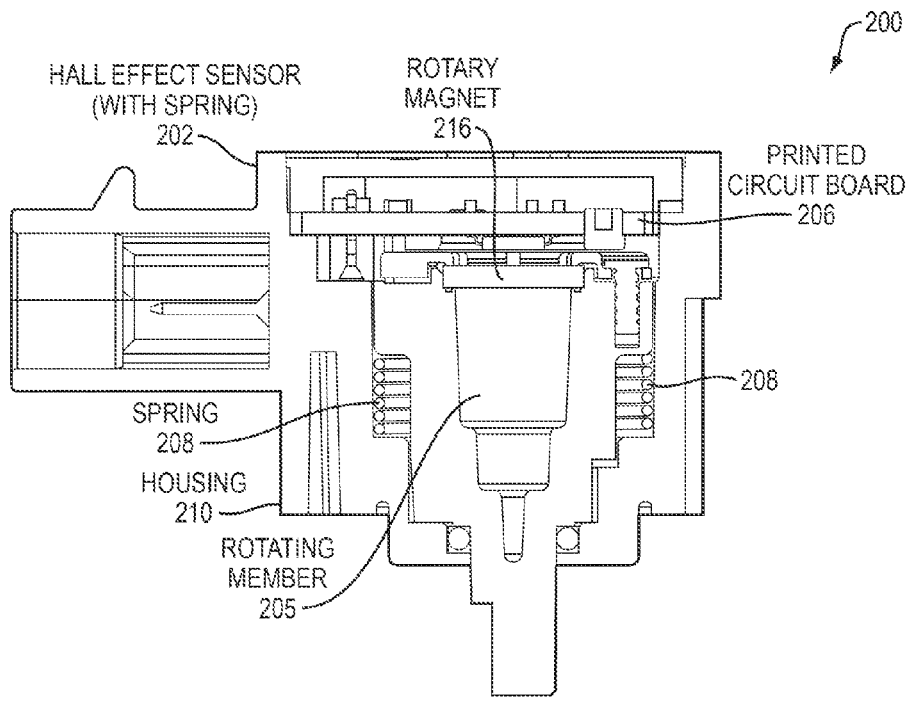
FIG. 2 is a block diagram illustrating an example embodiment of a traditional Hall effect sensor (with a spring).

FIG. 2 is a block diagram 200 illustrating an example embodiment of a traditional Hall effect sensor 202 that includes a spring 208. The traditional Hall effect sensor 202 includes a printed circuit board 206 configured to determine angular rotation of a to-be-sensed rotating member 205 within a housing 210 from a rotary magnet 216. The printed circuit board 206 includes a Hall effect sensor configured to detect the movement of the rotating member 205 by detecting the rotary magnet 216. The housing 210 further includes the spring 208 that is configured to apply pressure to the rotating member 205. The pressure causes the rotating member 205 to be limited to a single turn, in embodiments where the Hall effect sensor 202 does not track multiple turns of the rotating member 205.

Figure 3:
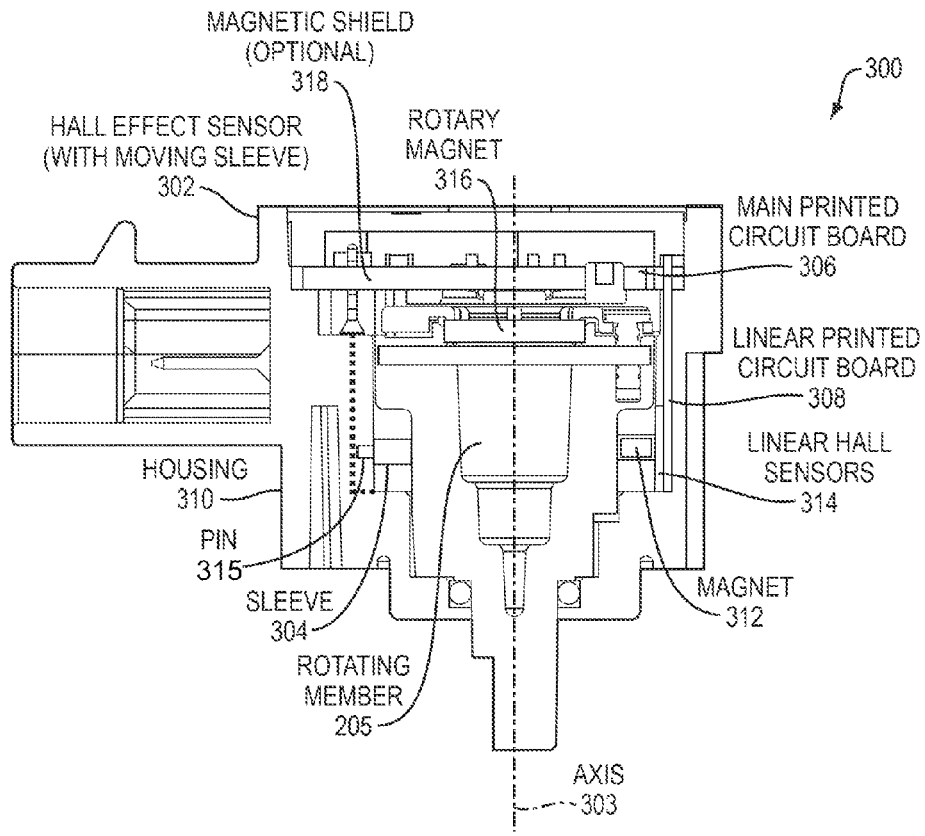
FIG. 3 is a block diagram illustrating an example embodiment of the Hall effect sensor 302 with a moving sleeve.

FIG. 3 is a block diagram 300 illustrating the Hall effect sensor 302 with a moving sleeve according to an example embodiment of the present invention. The Hall effect sensor 302 includes a mother printed circuit board 306, similar to the printed circuit board 206 of FIG. 2, coupled with a daughter printed circuit board 308 (e.g., a linear printed circuit board)

of FIG. 3, which is configured to track multiple turns of the rotating member 205. A housing 310 contains both printed circuit boards 306 and 308. The housing 310 can be similar to the housing 210 of FIG. 2; however, the housing 310 includes a bored-out hole to house the linear printed circuit board 308. The linear printed circuit board 308 includes a plurality of linear hall sensors 314. In one embodiment, six linear Hall effect sensors 314 are coupled to the linear printed circuit board 308; however, any number of linear Hall effect sensors 314 or transducers can be employed. The Hall effect sensor 302 further includes a sleeve 304 around the rotating member 205. The sleeve 304 is configured to travel axially along the rotating member 205 in response to rotation of the rotating member 205. The sleeve is further configured to have complementary retaining members, such as a pin 315, to keep the sleeve 304 in place rotationally relative to the rotating member 205. Keeping the sleeve 304 in place rotationally allows a magnet 312 that is coupled to the sleeve 304 to remain at a same distance relative to the plane of the linear Hall effect sensors 314. The magnet 312, along with the sleeve 304, travels parallel to the axis 303 of the rotating member 205 and the linear Hall effect sensors 314.

In one embodiment, optionally, the Hall effect sensors 302 include a magnetic shield 318 that shields the linear Hall effect sensors 314 from interference from the rotating magnet 316 of the Hall effect sensor 302. The magnetic shield 318 is optional because the mother printed circuit board 306 and/or daughter linear printed circuit board 308 can calculate and eliminate the interference from the permanent magnet 316 and accurately determine the number of turns made by the rotating member 205.

FIG. 4A is a block diagram 400 illustrating an example embodiment of the rotating member 205 with a sleeve 402 in a full clockwise position. In one embodiment, the rotating member 205 includes six turn grooves 404; however, any number of turn grooves can be employed. The sleeve 402 is engaged along those grooves 404 such that when the rotating member is turned clockwise, the sleeve 402 is in the full clockwise position.

FIG. 4B is a block diagram 420 illustrating an example embodiment of the rotating member 205 with a sleeve 402' in a middle position. The sleeve 402', in FIG. 4B, has moved axially along the rotating member 205 to be between a full clockwise position and a full counterclockwise position.

FIG. 4C is a block diagram 440 illustrating another example embodiment of the rotating member 205 with a sleeve 402" in a full counter clockwise position. The sleeve 402" is in a full counterclockwise position.

FIG. 5 is a block diagram 500 illustrating an example embodiment of a sleeve 504. The sleeve 504 includes an anti-rotation pin 508. An anti-rotation pin 508 is an example of a retaining member that can be coupled with the housing to maintain a rotational alignment of the sleeve 504 relative to the rotating member 205. This arrangement keeps a magnet 506 (e.g., a linear magnet) coupled to the sleeve 504 in a rotationally constant position as the sleeve 504 travels axially along the rotating member 205. The sleeve 504 can further include a spring-loaded ball 503 that fits in the grooves of the rotating member. The spring-loaded ball 503 prevents the sleeve from falling off the rotating member at the end of the full clockwise position.

Figure 6A:
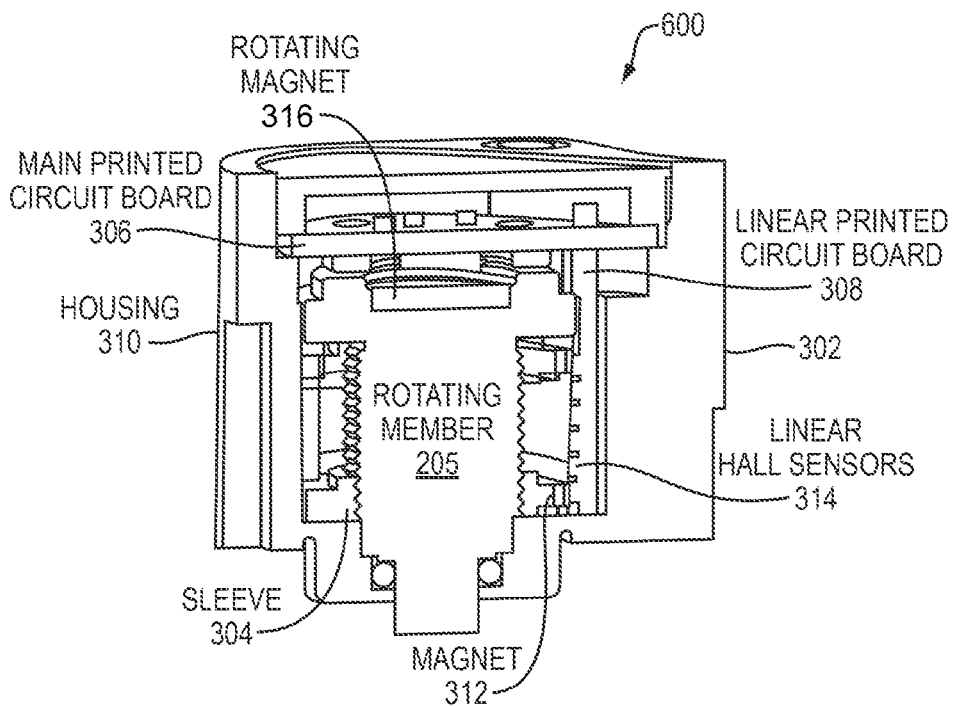
FIG. 6A is a block diagram illustrating a cross-section of a Hall effect sensor employed by an embodiment of the present invention.

FIG. 6A is a block diagram 600 illustrating a cross-section of a Hall effect sensor 302 employed by an embodiment of the present invention. The Hall effect sensor 302 includes a housing 310 holding a rotating member 205, a mother printed circuit board 306, and a daughter printed circuit board 308. The linear Hall effect sensors 314 detect the position of the magnet 312 as the sleeve 304 travels axially along the rotating member 205. The linear printed circuit board 308 combines the information collected by the linear Hall effect sensors 314 so that the mother printed circuit board 306 and daughter printed circuit board 308 can calculate the number of turns the rotating member 205 has made.

Figure 6B:
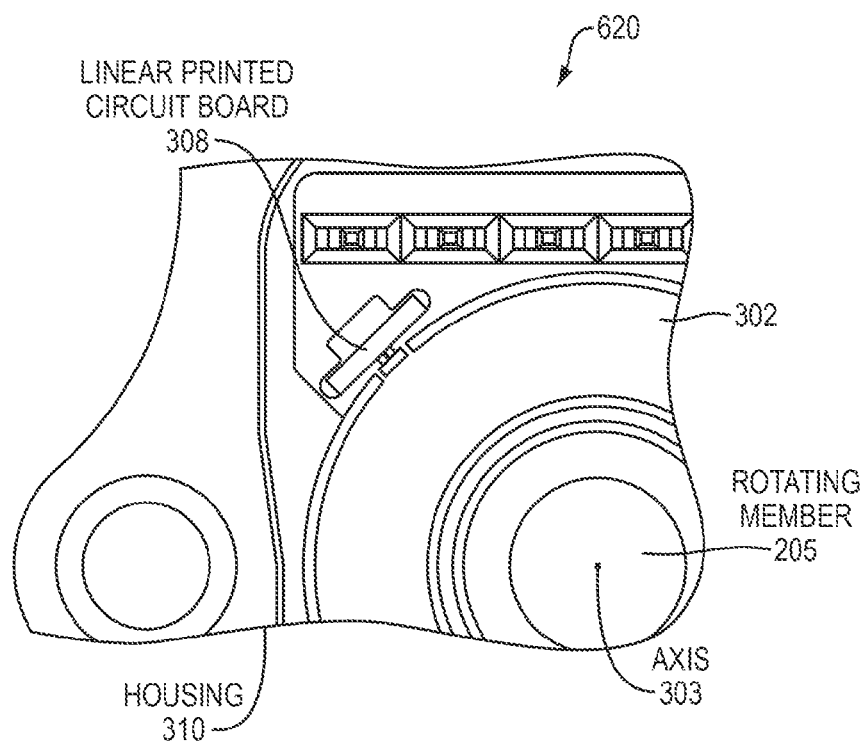
FIG. 6B is a block diagram illustrating a top-down view of a cross section the Hall effect sensor employed by an embodiment of the present invention.

FIG. 6B is a block diagram 620 illustrating a top-down view of a cross section of the Hall effect 302 sensor employed by an embodiment of the present invention. The Hall effect sensor 302 includes the housing 310, the rotating member 205, and the linear printed circuit board 308. The linear print circuit board 308 is located in a hole drilled or bored through a housing 310 that is parallel to an axis 303 of the rotating member 205.

Figure 6C:
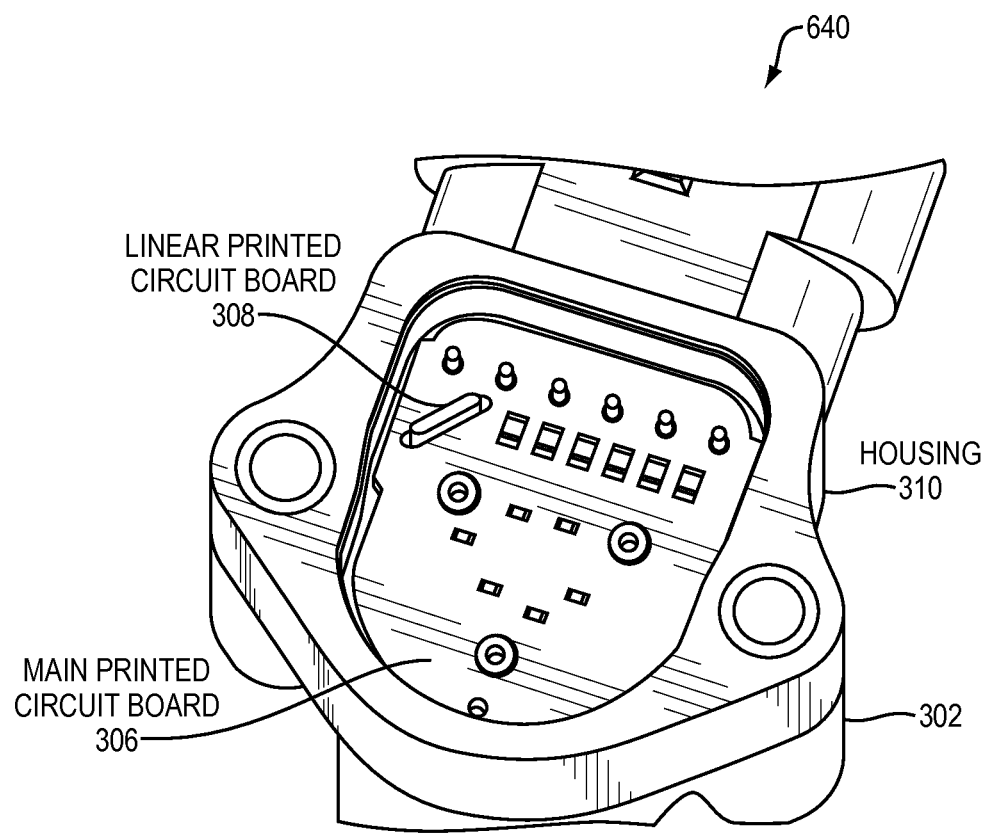
FIG. 6C is a block diagram illustrating an example embodiment of the present invention from another top view illustrating a cross-section of the Hall effect sensor.

FIG. 6C is a block diagram 640 illustrating an example embodiment of the present invention from another top view illustrating a cross-section of the Hall effect sensor 302. The Hall effect sensor 302 includes the housing 310, the mother printed circuit board 306, and the daughter printed circuit board 308, where the daughter printed circuit board is coupled to the mother printed circuit board 306. The rotating member 205, shown in FIGS. 6A and 6B, is located beneath the main printed circuit board 306 in FIG. 6C.

Figure 7B:
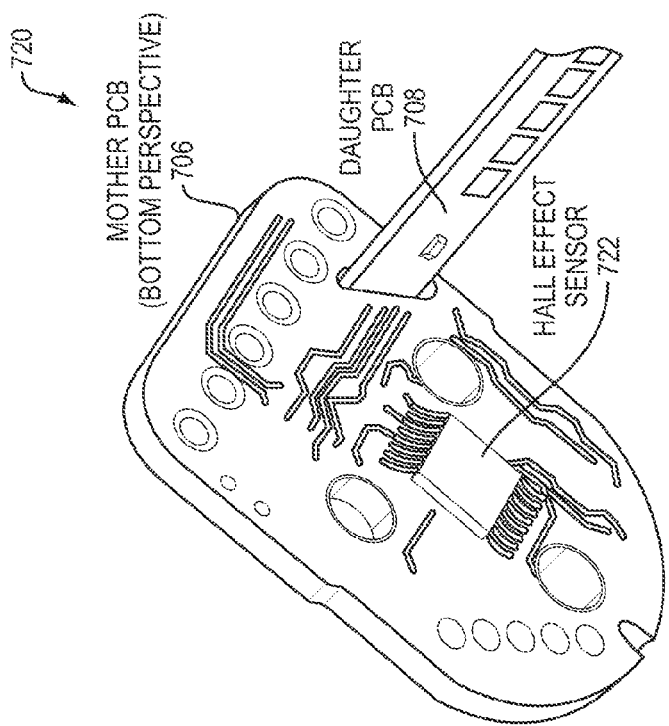
FIG. 7B is a block diagram illustrating an example embodiment of the main printed circuit board from a bottom perspective.
Figure 7A:
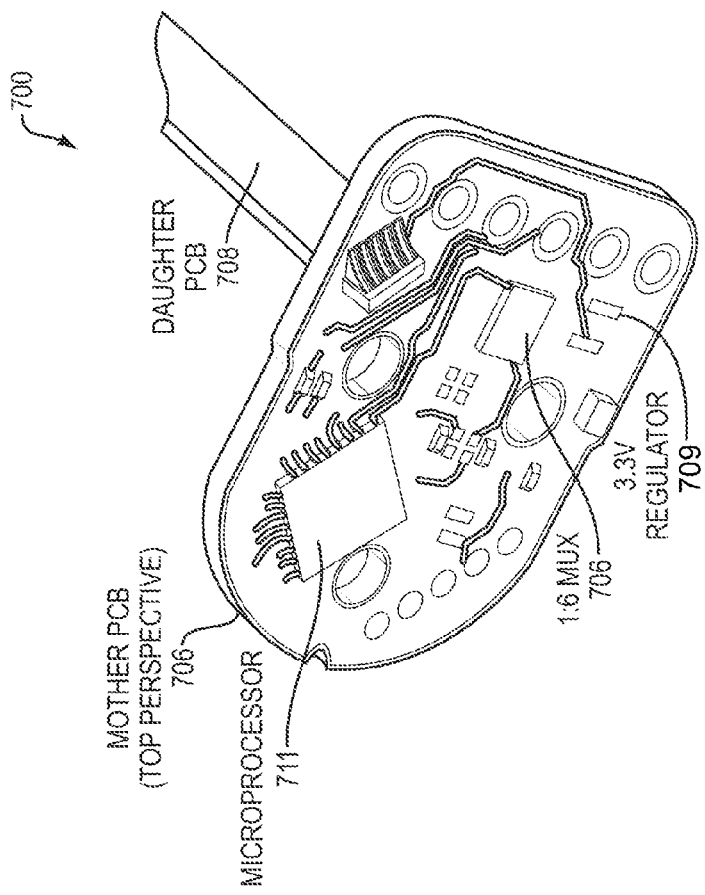
FIG. 7A is a block diagram illustrating an example embodiment of the main (mother) printed circuit board from a top perspective and the linear (daughter) printed circuit board.

FIG. 7A is a block diagram 700 illustrating an example embodiment of a mother printed circuit board 706 from a top perspective and a daughter printed circuit board 708. The mother printed circuit board 706 includes a microprocessor 711, a multiplexer 706, which can be a 1-to-6 multiplexer, and a 3.3 volt regulator. A person of ordinary skill in the art can recognize that the microprocessor 711, multiplexer 706, and voltage regulator 708 can be of different varieties. The multiplexer 706 can select among the six linear sensors (e.g., linear position sensors 762 of FIG. 7D) of the daughter printed circuit board 708. In another embodiment, with a different number of linear transducers on the daughter printed circuit board 704, the multiplexer 706 can be a different type of multiplexer. The microprocessor 711 is configured to determine, based on outputs of the linear transducers forwarded to the microprocessor 711, the number of turns made by the rotating member (not shown).

FIG. 7B is a block diagram 720 illustrating an example embodiment of the mother printed circuit board 706 from a bottom perspective. The mother printed circuit board 706 is mounted to the daughter print circuit board 708 at a right angle, and includes a Hall effect sensor 722. The Hall effect sensor 722, for example, can be a commercially available CMOS Hall effect sensor. The Hall effect sensor 722 can detect the angular position of a magnet (not shown), such as the permanent magnet coupled to the rotating member (not shown).

Figure 7D:
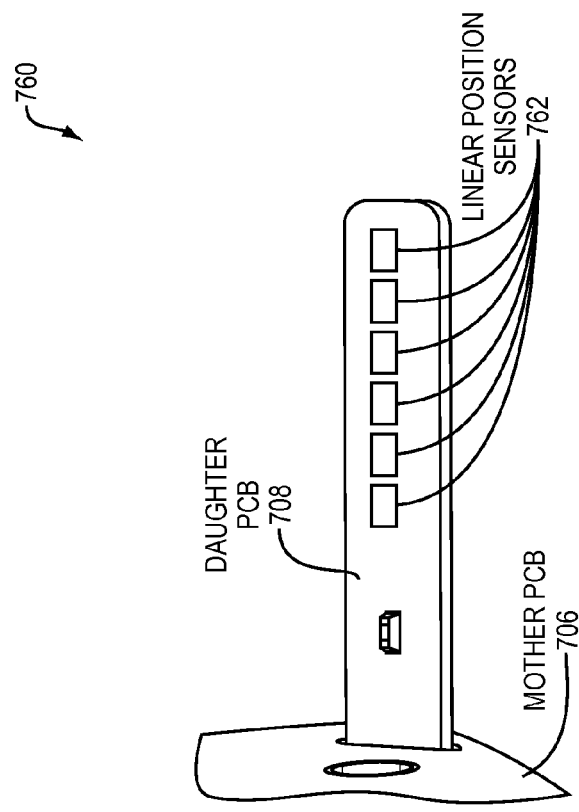
FIG. 7D is a block diagram illustrating another example embodiment of the linear printed circuit board coupled with the main printed circuit board.
Figure 7C:
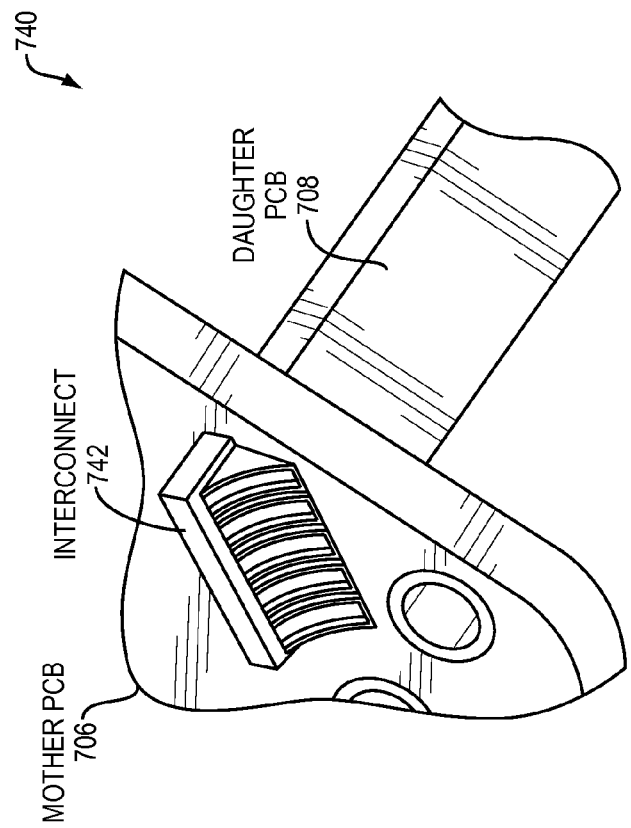
FIG. 7C is a block diagram illustrating an example embodiments of an interconnect between the main printed circuit board and the linear printed circuit board.

FIG. 7C is a block diagram 740 illustrating an example embodiment of an interconnect 742 between the mother printed circuit board 706 and the daughter printed circuit board 708. The interconnect 742 is an example of a coupling used to connect the daughter printed circuit board 708 to the mother printed circuit board 706 by solder connections to the mother printed circuit board 706.

FIG. 7D is a block diagram 760 illustrating another example embodiment of the daughter printed circuit board 708 coupled with the mother print circuit board 706. The daughter printed circuit board 708 includes a plurality of linear position sensors 762. The linear position sensors 762 can be, for example, the commercially available linear position sensors or custom manufactured linear position sensors. The linear position sensors 762 can determine absolute position of a linear movement of a magnet, such as the linear magnet (not shown) on the sleeve (not shown) in the embodiment of the present Hall effect sensor illustrated in FIGS. 3-6C. The absolute position can correlate to the number of turns of the rotating member. In the embodiment of FIG. 7D, six linear position sensors are employed; however, any number can be employed to detect a greater or fewer number of turns of the rotating member.

Figure 8B:
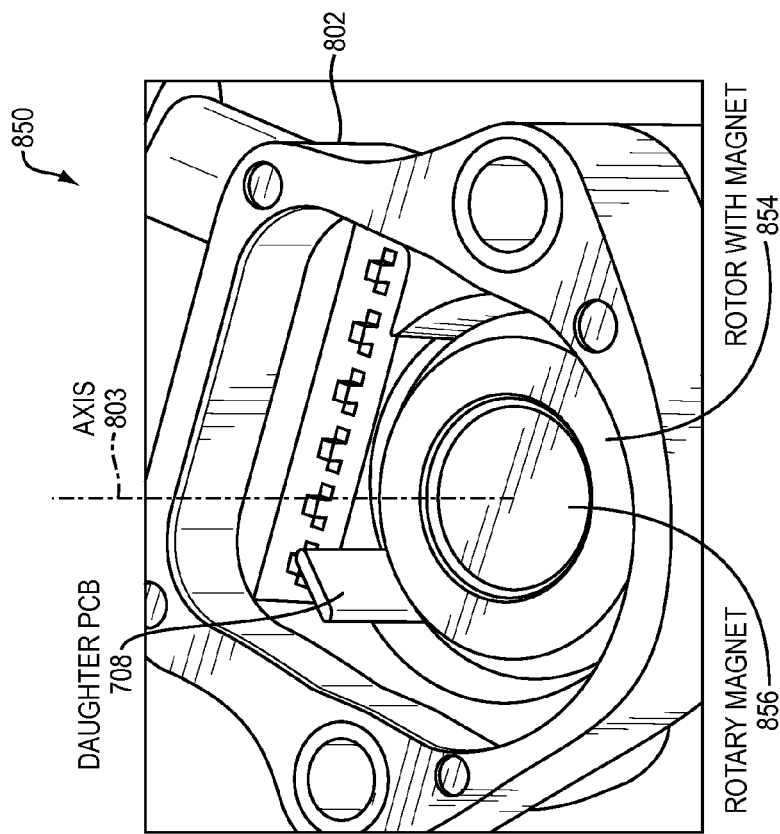
FIG. 8B is a block diagram illustrating an example embodiment of the Hall effect sensor in its housing.
Figure 8A:
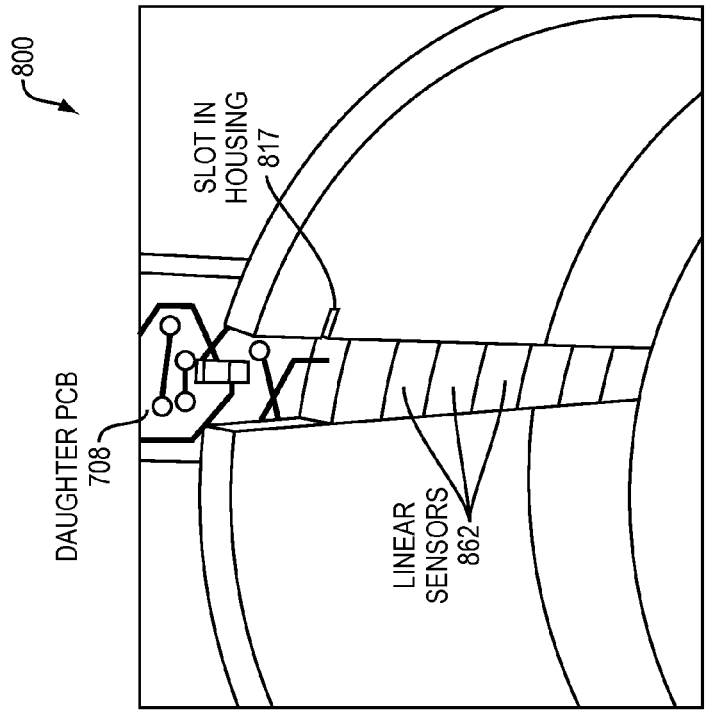
FIG. 8A is a diagram illustrating an example embodiment of the linear printed circuit board shown in a slot in the housing.

FIG. 8A is a diagram 800 illustrating an example embodiment of the daughter printed circuit board 708 shown in a slot 817 in the housing. The daughter printed circuit board 708 includes the linear sensors 862 which are arranged parallel to the axis of the rotating member along the slot 817 in the housing.

FIG. 8B is a diagram 850 illustrating an example embodiment of the Hall effect sensor 802 in its housing. The Hall effect sensor includes the daughter printed circuit board 708, which is parallel to the axis 803 of the rotor 854 with the rotary magnet 856.

Figure 9B:
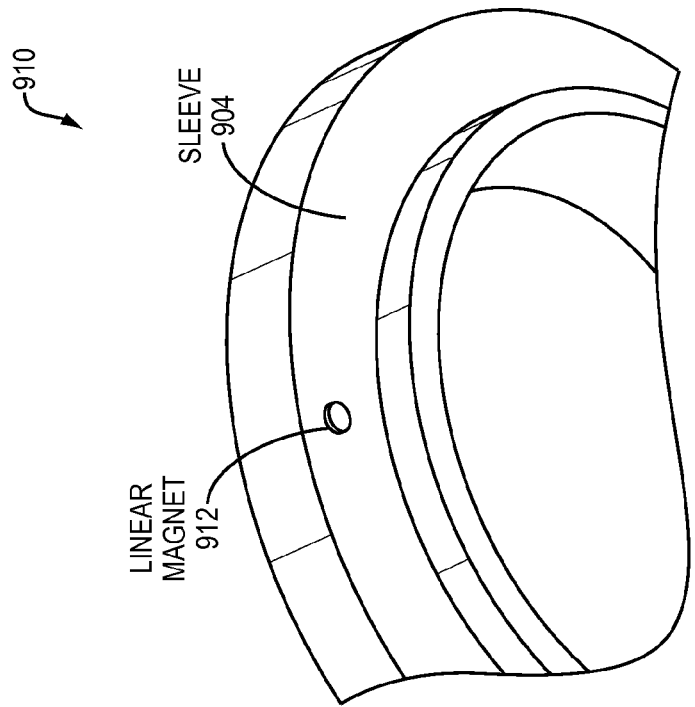
FIG. 9B is a block diagram illustrating an example embodiment of the sleeve.
Figure 9A:
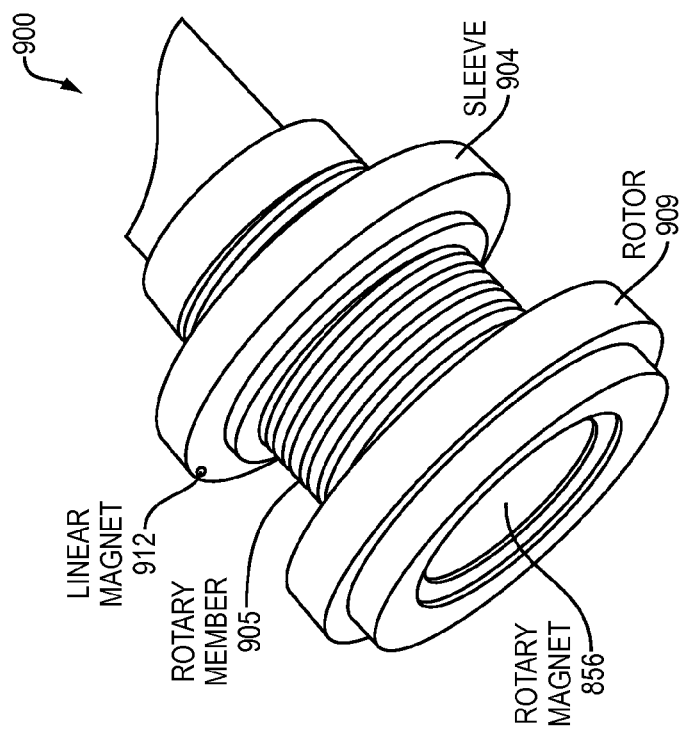
FIG. 9A is a block diagram illustrating an example embodiment of the rotating member including a sleeve employed by an example embodiment of the present invention.

FIG. 9A is a block diagram 900 illustrating an example embodiment of the rotating member 905 including a sleeve 904 employed by the present invention. The sleeve 904 includes a linear magnet 912. The sleeve 904 is also configured to complement threads of a rotor 909 such that it can grip the rotating member 905. The rotating member 905 further includes the rotary magnet 856 to determine angular position of the rotating member 905. The linear magnet 912 is arranged to determine vertical position, and therefore the number of turns, of the rotating member 905.

FIG. 9B is a block diagram 910 illustrating an example embodiment of the sleeve 904. The sleeve includes a linear magnet 912. The position of the linear magnet 912, as described above, is configured to be detected by the linear position sensors of daughter printed circuit board (not shown) to determine the number of turns that the rotating member has made.

FIG. 10A is a graph 1000 illustrating an example embodiment of an ideal linear sensor output. The ideal linear sensor output 1001 is the output of a linear sensor without interference from magnets, a Hall effect sensor, other linear sensors, or other sources of interference. The large rotary magnet and sensor output determine the position of the rotor between 0 and 360 degrees. The multiple linear sensors, however, detect the position of a much smaller, secondary magnet in the sleeve to determine how many times the sensor has rotated. In one embodiment, vertical axis in FIG. 10A represents the digital output from a 10-bit Hall effect sensor with a zero field value of 512 counts and an amplitude of 512 on either side, depending on magnetic polarity. However, a person of ordinary skill in the art can recognize that the Hall effect sensor can have different zero field values and amplitudes.

Figure 10B:
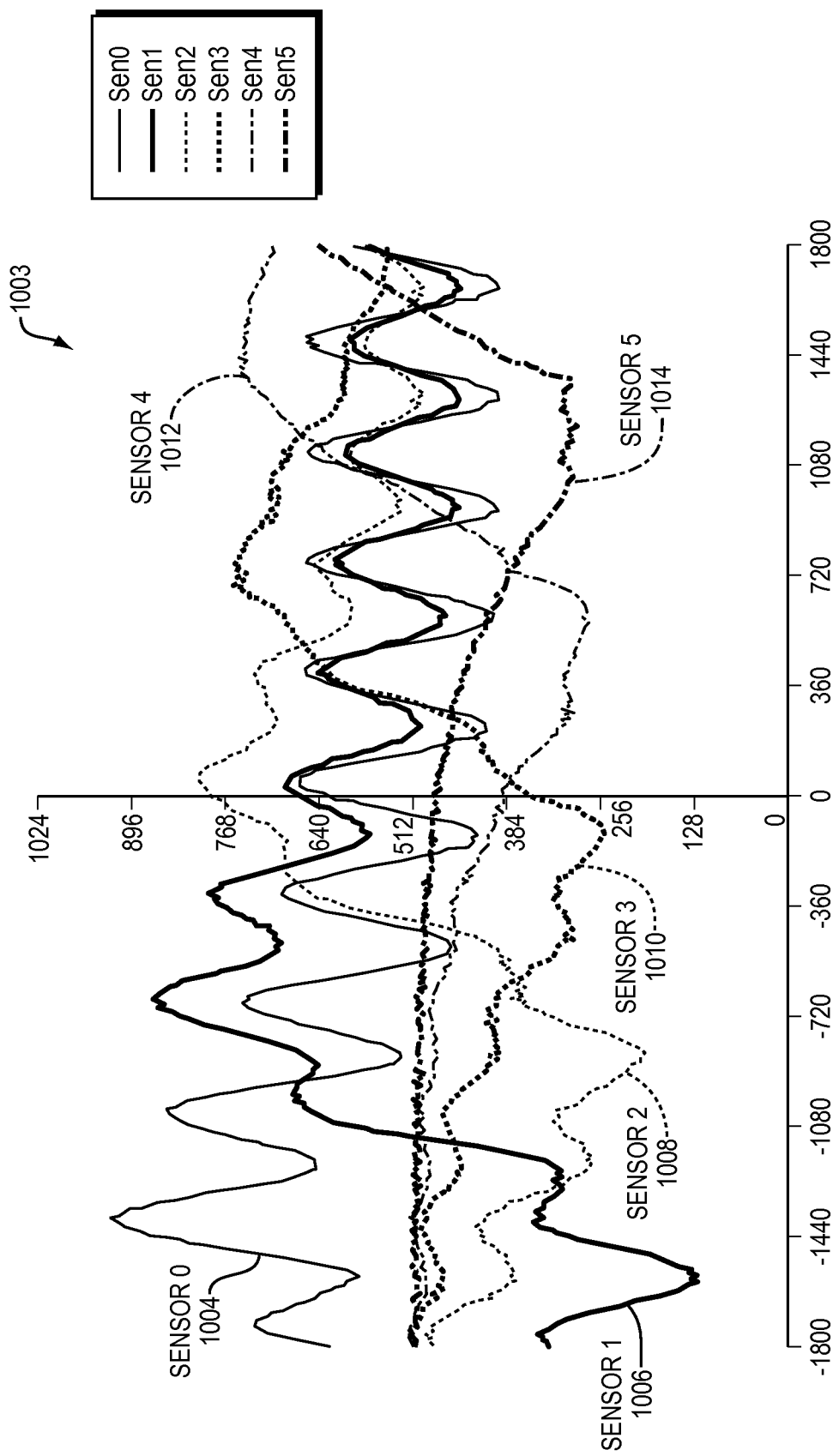
FIG. 10B is a graph illustrating example embodiments of linear sensor output from the linear printed circuit board over ten turns of the rotor.

FIG. 10B is a graph 1003 illustrating example embodiments of linear sensor output from the linear printed circuit board over ten turns of the rotor (e.g., 3600 degrees of rotation). In general, a sensor closer to the rotary magnet receives higher interference from the rotary magnet than a sensor further away from the rotary magnet. In certain embodiments, a magnetic shield can protect the linear sensors from such interference. However, methods can be employed to determine, based on information from all of the sensors (e.g., sensors zero through five), and eliminate such interference and accurately determine the turn count of the rotating member. For example, sensor 0 1004 receives high interference because it is the closest to the rotary magnets. Sensor 1 1006 also includes high interference because it is the second closest to the magnet. Sensor 5 1014 is furthest away and has almost no interference from the larger magnet. Each wave output of each sensor, however, has ten sine wave peaks per output since the rotor turns ten times.

Figure 10C:
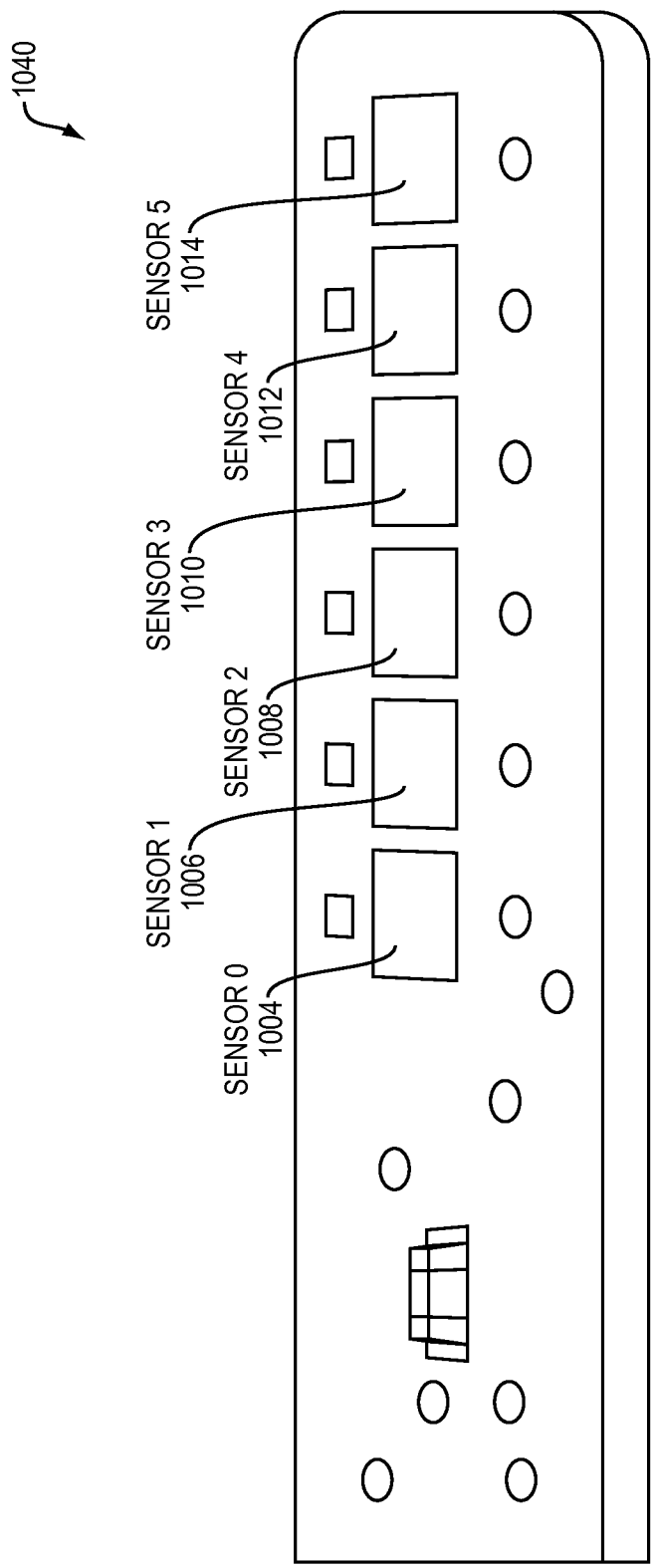
FIG. 10C is a block diagram illustrating the orientation of the plurality of sensors.

FIG. 10C is a block diagram 1040 illustrating the orientation of the plurality of sensors. The sensor 0 1004 is closest to the rotary magnet followed by sensor 0 1004, sensor 1 1006, sensor 2 1008, sensor 3 1010, sensor 4 1012, sensor 5 1014.

Figure 11:
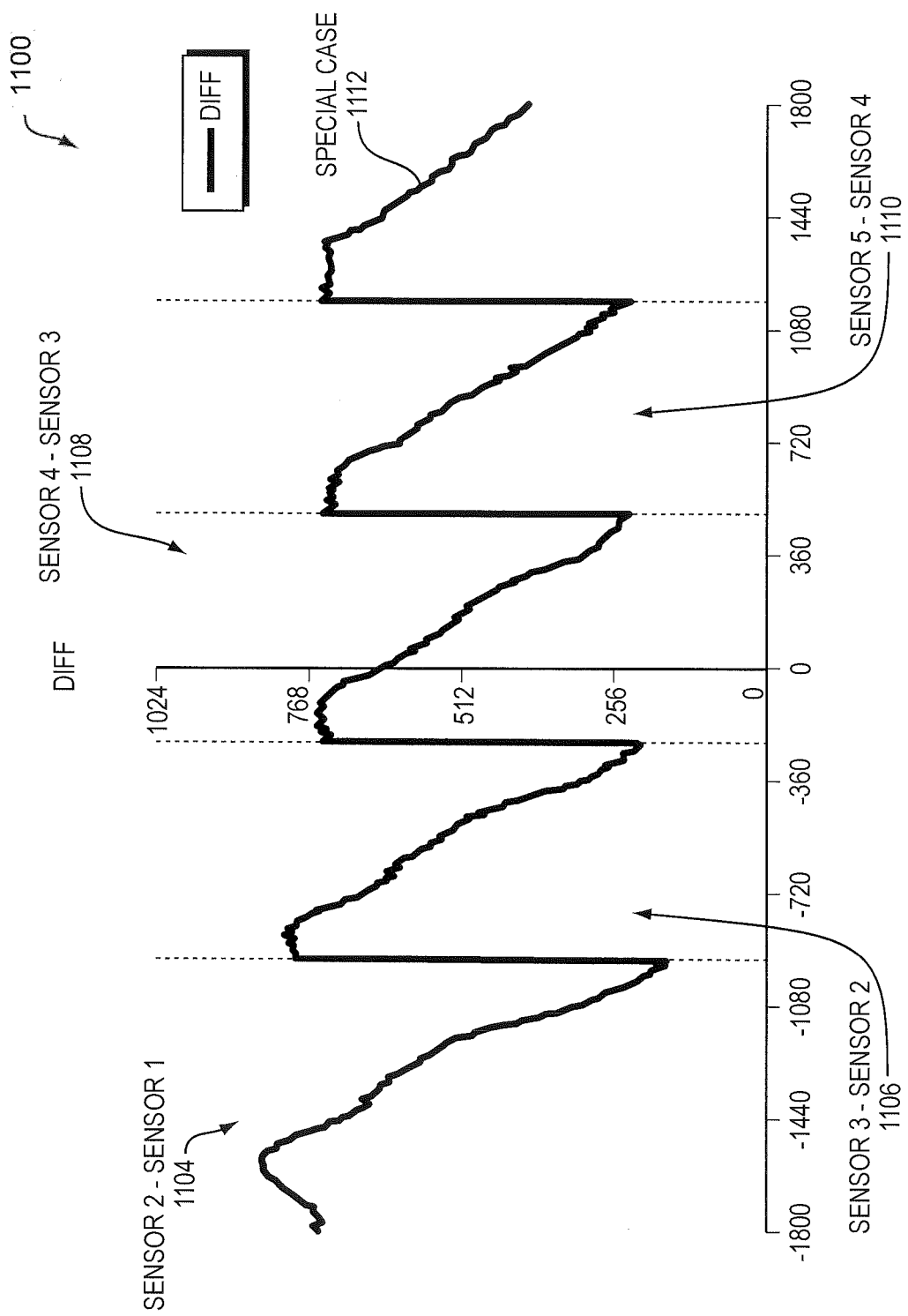
FIG. 11 is a graph illustrating an example embodiment of differences between (or among) the sensors, which is a property employed to reduce the interference of the rotary magnet.

FIG. 11 is a graph 1100 illustrating an example embodiment of differences between the sensors, which is a property employed to reduce the interference of the rotary magnet. In different sections of the graph, differences are calculated to reduce interference. For example, on the leftmost portion of the graph the difference of sensor two and sensor one 1104 is calculated. Moving rightward, the difference of sensor three and sensor two 1106 is calculated, followed by the difference of sensor four and sensor three 1108, and then the difference of sensor five and sensor four 1110. On the rightmost portion of the graph is a special case 1112 that represents the area where there is no higher sensor to subtract. The difference value is derived by using the difference between two sensors, which eliminates sine wave interference from the position information and provides a means to determine the correct turn. Whenever a sensor has a maximum value (as shown in FIG. 10B), the difference between two succeeding sensors can be calculated. For example, when sensor zero has a maximum value, the difference is calculated from sensor 2 and sensor 1. When sensor 4 has the maximum value, a special case is calculated since there is only one successive sensor because sensor 5 is the only available sensor higher numbered, as there is no sensor 6 in this embodiment.

Figure 12A:
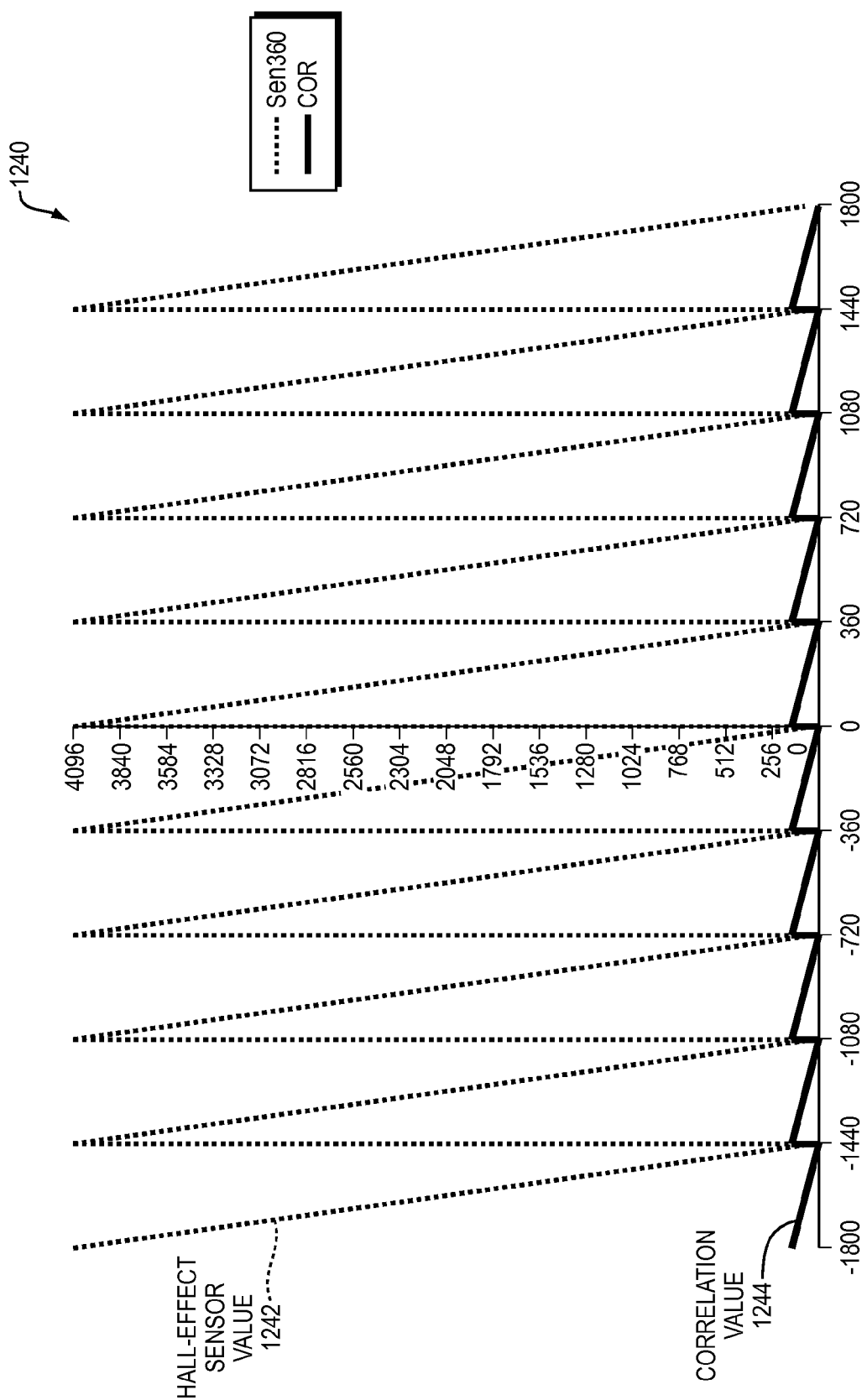
FIG. 12A is a graph illustrating a Hall effect sensor value and a corresponding correlation value.

FIG. 12A is a graph 1240 illustrating a Hall effect sensor value 1242 and a corresponding correlation value 1244. In addition to the difference value, a correlation value is a scaled version of the Hall effect sensor value 1242 (e.g., the main 360 degree sensor). The correlation value is the value of the main sensor divided by 30, in one embodiment, and is used to determine the turn number. In one embodiment, the vertical axis in FIG. 12A represents a digital output from a 12-bit rotary Hall effect sensor. The value of the 12-bit rotary Hall effect sensor varies from zero to 4096, the values corresponding to a rotation from zero to 360 mechanical degrees (or zero to two pi radians). The output repeats ten times for ten turns of the rotor. A person of ordinary skill in the art can recognize that a rotary Hall effect sensor of other resolutions can be employed.

Figure 12B:
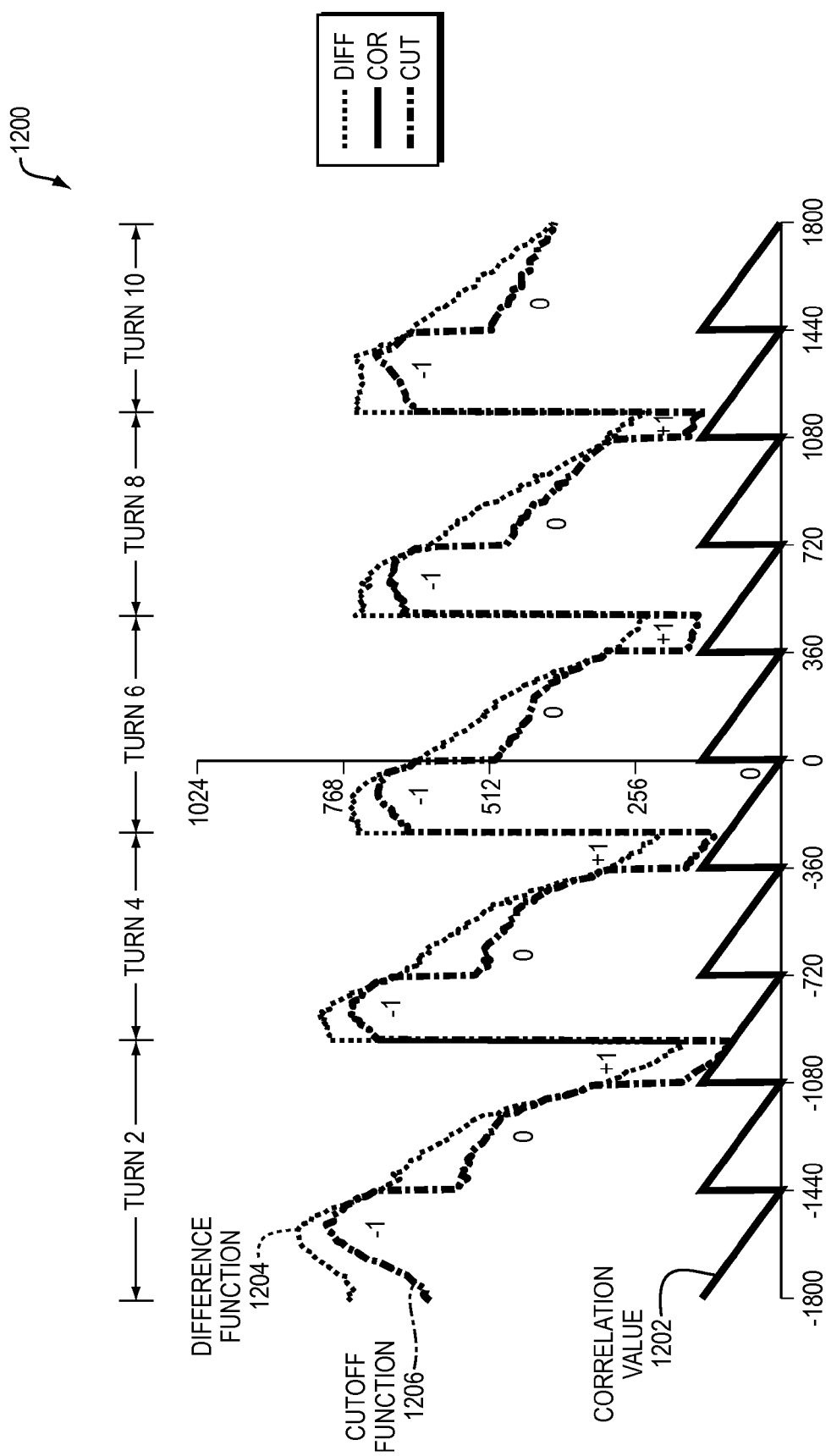
FIG. 12B is a graph illustrating a hall function that indicates when the Hall effect sensor has made a complete turn.

FIG. 12B is a graph 1200 illustrating a hall function that indicates when the Hall effect sensor has made a complete turn. The cutoff function 1206 corresponds with the correlation value 1202 which indicates the true turning of the Hall effect sensor. The cutoff function is calculated by subtracting the correlation value 1202 from the difference value 1204. The cutoff function, every time there is a discontinuity, can determine that a turn has been made and can increase or decrease the count based on the discontinuity.

The cutoff function 1206 is designed to have discontinuities at the same position of the Hall effect sensor. The discontinuities synchronize the value of the correct turn to the Hall effect sensor and provides for variation in the linear sensors. The final value for the correct turn of the sensor is 2, 4, 6, 8, 10 for each sensor 0, 1, 2, 3, and 4. This is then modified by the cutoff function 1206. If the cutoff function 1206 is above 600, then 1 is subtracted from the turn value, but if the cutoff function 1206 is less than 250, 1 is added to the turn value.

Figure 12C:
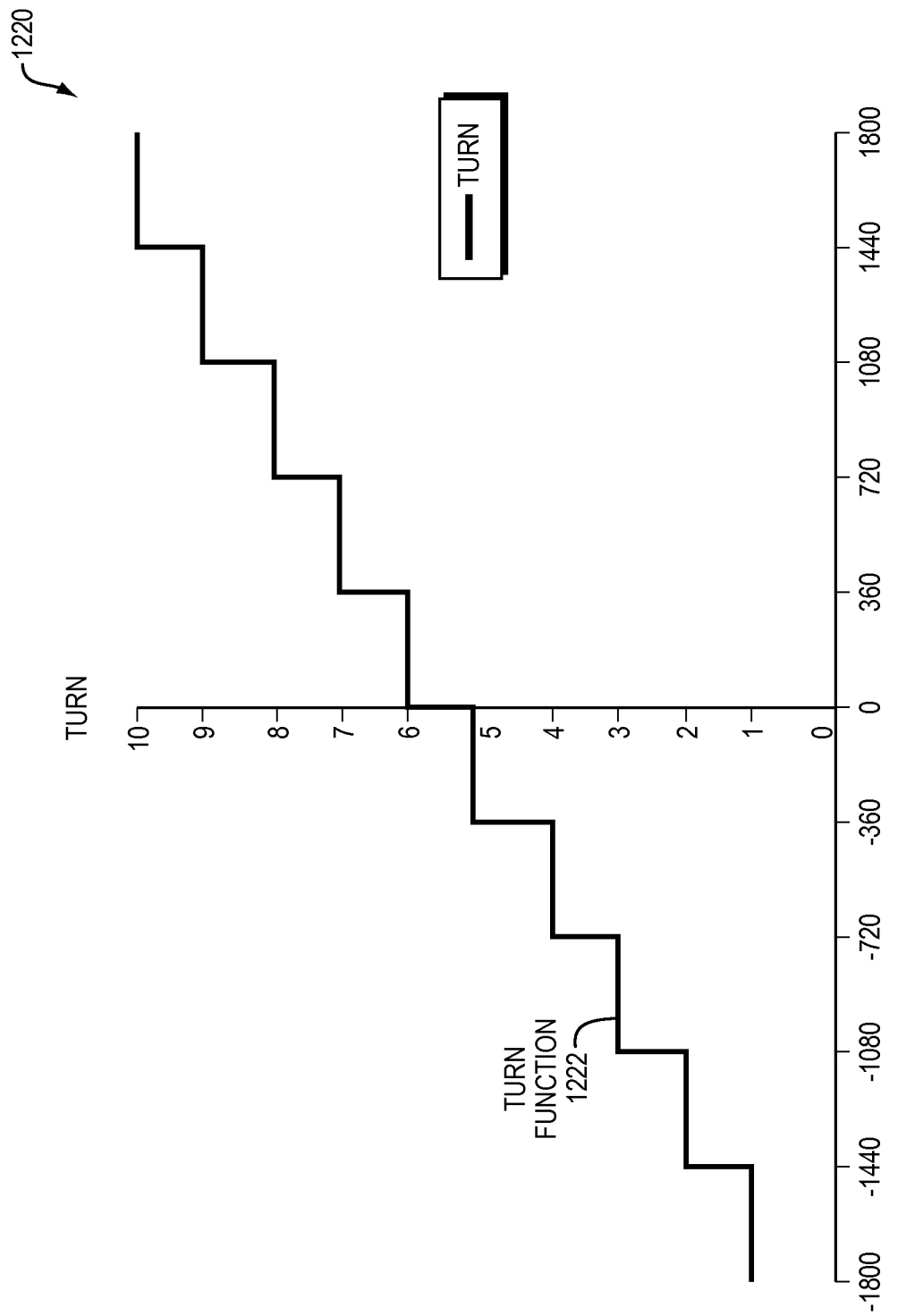
FIG. 12C is a graph illustrating a turn function.

FIG. 12C is a graph 1220 illustrating a turn function 1222. The turn function increases by one for 360 degree turn of the Hall effect sensor. In one embodiment, the value of the turn function 1222 is multiplied by the number of counts per turn (e.g., 4096) and combined with the output of the Hall effect sensor to provide a full ten turn output that retains accuracy and resolution of the Hall effect sensor.

Figure 13:
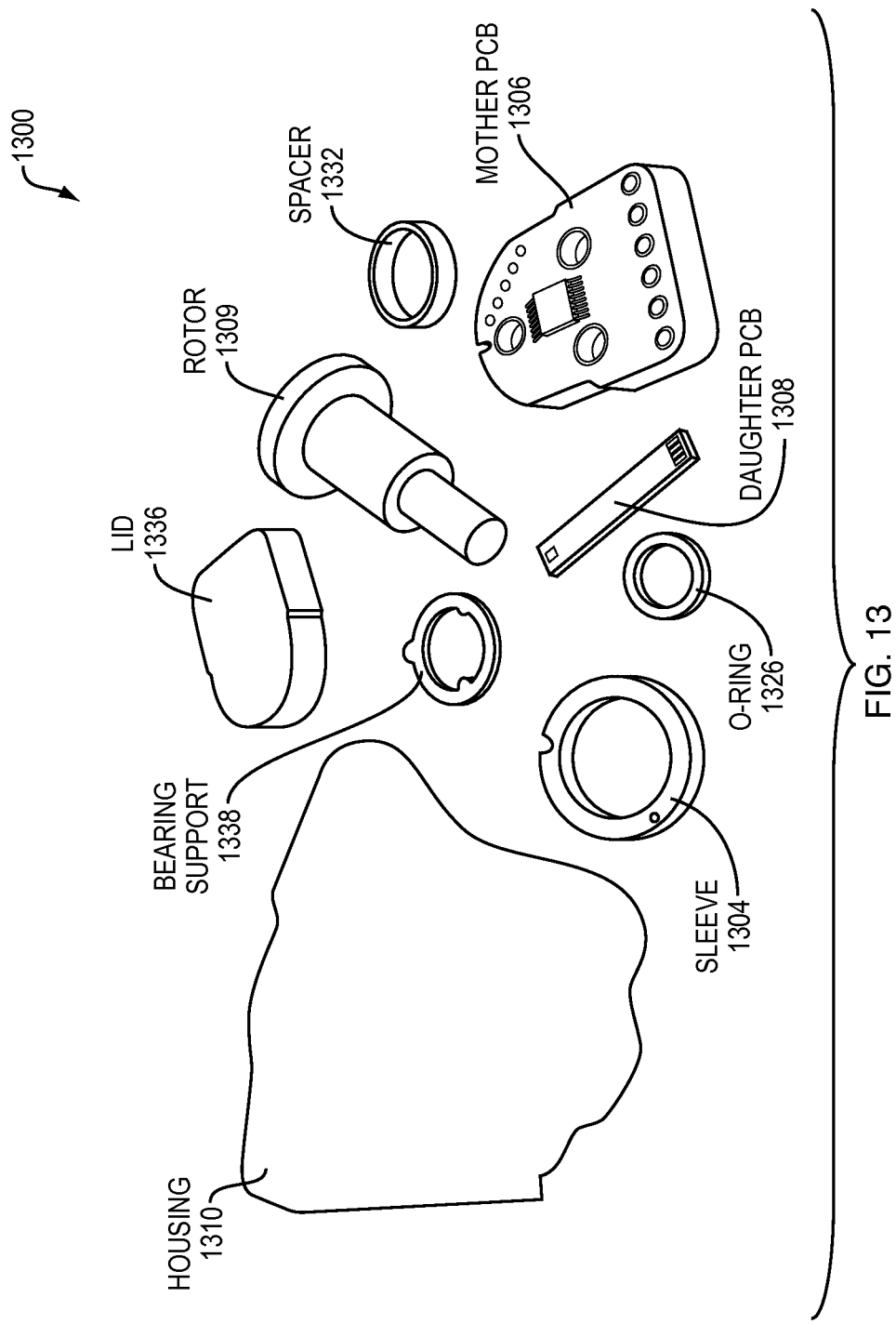
FIG. 13 is a block diagram illustrating the parts involved in making the Hall effect sensor.

FIG. 13 is a block diagram 1300 illustrating the parts involved in making the Hall effect sensor according to an embodiment of the present invention. The Hall effect sensor includes a housing 1310, a sleeve 1304, an O-ring 1326 and a bearing support 1338. The housing further can include a lid 1336. A rotor 1309 is mounted in the housing 1310 and includes the rotary magnet. The rotor 1309 can further be employed to hold the bearing support 1338, the spacer 1332, the O ring 1326, and the sleeve 1304, which includes the linear magnet. The mother printed circuit board 1306 and daughter printed circuit board 1308 are configured to be mounted to each other and detect the position of the rotary magnet of the rotor and the linear magnet of the sleeve as the rotating member rotates.

Figure 14:
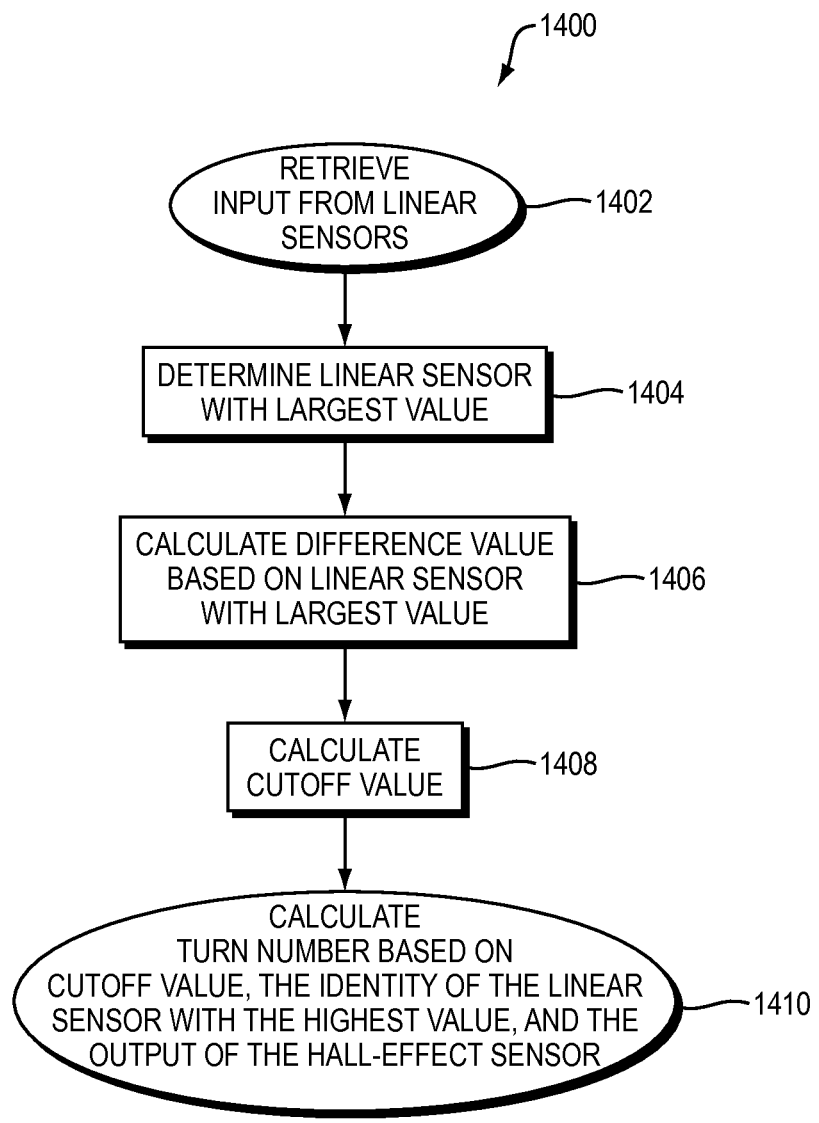
FIG. 14 is a flow diagram illustrating an example embodiment of a process employed by an example embodiment of the present invention.

FIG. 14 is a flow diagram 1400 illustrating an example embodiment of a process employed by an example embodiment of the present invention. The embodiment of the process employs six linear sensors. Each of the linear sensors can be 10-bit devices, which have output values ranging from 0 to 1023. The process further employs one rotary Hall effect sensor. The rotary sensor is a 12 bit device, which values range from 0 to 4095. The final result has 10 times the resolution of the rotary hall sensor, which means the final output ranges from 0 to 40959.

The process starts by retrieving input from the linear sensors (1402). Then, the process determines the linear sensor with the largest output value (1404). The process does this by cycling through all of the sensors, reading their respective values, and determining the largest output value of the sensor after all sensors have been cycled through.

The process then calculates a difference value based on the linear sensor with the largest value (1406). If the linear sensor with the largest value is any sensor other than the second to last sensor (e.g., sensor 4), the process calculates a difference value of the next two highest indexed sensors and adds a constant (e.g., 600). The last sensor (e.g., sensor 5 as shown in FIG. 10B) is shown not to have the largest value at any point. For example, if the third sensor has the highest value, the system subtracts the output of the fifth sensor from the output of the fourth sensor, and adds the constant. On the other hand, if the largest value is the second to last sensor (e.g., sensor 4), the difference value is the difference of a constant (e.g., 1040) and the last sensor (e.g., sensor 5).

Then, the process calculates a cutoff value (1408). First, the process calculates a correlation value equal to the value of the rotary Hall effect sensor divided by 30. Then, the system calculates the cutoff value by subtracting the correlation value from the difference value.

The process calculates a turn number based on the cutoff value, the identity of the linear sensor with the highest value, and the output of the Hall effect sensor (1410). If the calculated cutoff value is greater than 600, then the process calculates a turn value of Turn=2×(Sensor Number+1)−1.

If the calculated cutoff value is between 250 and 600, the process calculates a turn value of Turn=2×(Sensor Number+1)

If the calculated cutoff value is less than 250, then the process calculates a turn value of Turn=2×(Sensor Number+1)+1

After calculating the turn value, the system determines an output value of

Output=4096×Turn−Rotary Hall Effect Sensor Output

Figure 15:
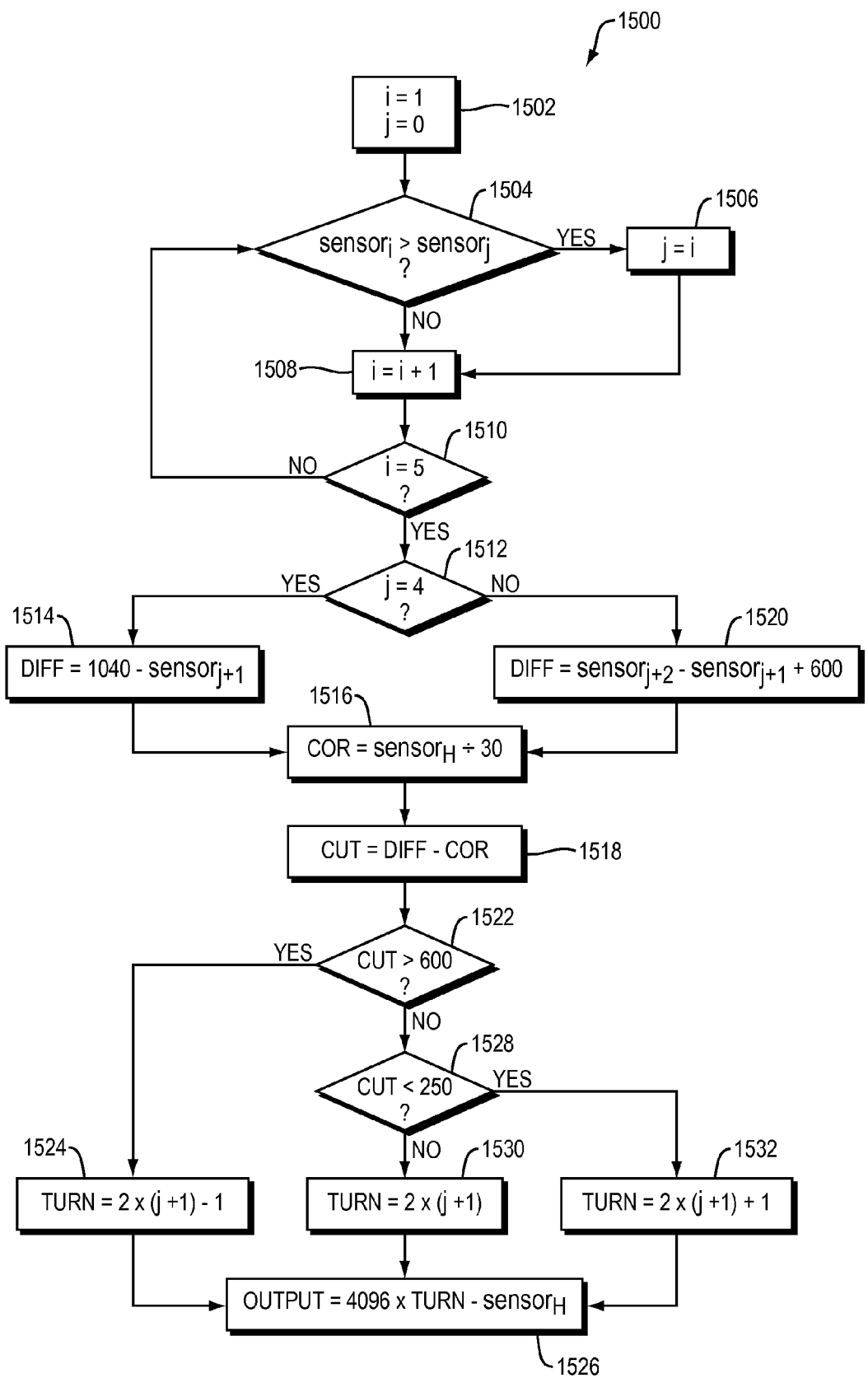
FIG. 15 is a flow diagram illustrating an example embodiment of a method used to implement the process of FIG. 14.

FIG. 15 is a flow diagram 1500 illustrating an example embodiment of a method used to implement the process of FIG. 14. In this embodiment, the linear sensors each correspond with an ordered index, the index of the linear sensor indicating its position. In this embodiment, there are six linear sensors, but the method can be modified to be employed with a different number of linear sensors. The method determines the sensor with a largest output value and calculates a difference value based on a sensor or sensors next to the sensor with the largest output value. The method then calculates a cutoff value based on the difference value and a correlation value that is itself based on the output of the Hall sensor. The method then calculates a turn value based on a range that the cutoff value is in, and calculates an output value representing the absolute angular position of the rotating member based on the turn value and output of the Hall effect sensor.

The method first initializes index i to one and index j to zero (1502). The method determines whether a sensor of index i has a greater output than a sensor of index j (1504). If so, the method sets the index j to the value of the index i (1506) and then increments the index i (1508). The method than determines whether the index i has a value of 5 (1510). If not, the method determines whether a sensor of index i has a greater output than a sensor of index j (1504).

If the index i has a value of 5 (1510), the method determines whether the index j has a value of four (1512). If not, the method creates a difference value equal to the output of a sensor of with an index of j+2 minus the value of the output of a sensor with an index of j+1, plus a constant of 600 (1520). The method then calculates a correlation value of the output of the Hall sensor divided by a constant of 30 (1516) and calculates a cutoff value equal to the difference value minus the correlation value (1518).

If the index j does have a value of 4, (1514), the method calculates the difference value in a special case, where only one sensor of a higher index is available because a sensor with an index of j+2 is outside of the range of sensors. The method calculates a difference value of a constant of 1040 minus the output of a sensor with an index of j+1. The method then calculates a correlation value of the output of the Hall sensor divided by a constant of 30 (1516) and calculates a cutoff value equal to the difference value minus the correlation value (1518).

The method determines whether the cutoff value is greater than 600 (1522). If so, the method determines a turn value equal to double the value of j+1, minus one. Then the system calculates an output value of 4096 times the turn value minus the value of the output of the Hall sensor (1526).

If the cutoff value is less than or equal to 600 (1522), the method determines whether the cutoff value is less than 250 (1528). If so, the method calculates a turn value equal to double value of j+1 (1530). Then the system calculates an output value of 4096 times the turn value minus the value of the output of the Hall sensor (1526).

If the cutoff value is greater than or equal to 250 (1528), then the method calculates a turn value equal to double the value of j+1, plus one (1532). Then the system calculates an output value of 4096 times the turn value minus the value of the output of the Hall sensor (1526).

While this invention has been particularly shown and described with references to example embodiments thereof, it will be understood by those skilled in the art that various changes in form and details may be made therein without departing from the scope of the invention encompassed by the appended claims.

What is claimed is:

1. A method of determining an absolute angular position of a rotating member, the method comprising:
   selecting at least one sensor of a plurality of sensors to serve as an at least one selected sensor, the selecting being based on outputs of the plurality of sensors; and
   calculating the absolute angular position of the rotating member based on an output of the at least one selected sensor and an angular position of the rotating member, by:
   calculating a first difference of a first output of a first sensor among the plurality of sensors of the at least one selected sensor and a second output of a second sensor among the plurality of sensors of the at least one selected sensor;
   calculating a cutoff value based on a second difference of the first difference and a ratio of the angular position of the rotating member;
   calculating a turn number based on the cutoff value, an identifier of the at least one selected sensor, and the angular position of the rotating member; and
   returning an output value based on an output difference of a multiple of the turn number from the angular position of the rotating member.

2. The method of claim 1, wherein selecting the at least one sensor of the plurality of sensors includes determining which sensor of the plurality of sensors is providing a highest output, and selecting the at least one sensor of the plurality of sensors based on a location of the at least one sensor of the plurality of sensors relative to the sensor determined to have the highest output.

3. The method of claim 1, wherein the multiple of the turn value is 4096.

4. The method of claim 1, wherein the output value represents the absolute angular rotation and the relative angular position of the rotating member.

5. The method of claim 1, further comprising adding a constant to the first difference.

6. The method of claim 1, wherein the plurality of sensors includes six sensors.

7. The method of claim 1, wherein the method is performed using at least one of the following: a field programmable gate array (FPGA), processor, and look up table (LUT).

8. The method of claim 1, wherein calculating the turn value includes:
   comparing the cutoff value to at least one range cutoff;
   determining a corresponding range thereof; and
   calculating the turn value based on the corresponding range determined.

9. The method of claim 8, wherein calculating the turn value is based on a value indicating a location of a given sensor with a highest output relative to other sensors among the plurality of sensors.

10. A system for determining an absolute angular position of a rotating member, the system comprising:
    a sensor selection module configured to select at least one sensor of a plurality of sensors to serve as an at least one selected sensor, the selecting being based on outputs of the plurality of sensors; and
    a calculation module configured to calculate the absolute angular position of the rotating member based on an output of the at least one selected sensor and an angular position of the rotating member, wherein the calculation module is configured to:
    calculate a first difference of a first output of a first sensor among the plurality of sensors of the at least one selected sensor and a second output of a second sensor of the plurality of sensors of the determined at least one sensor;
    calculate a cutoff value based on a second difference of the first difference and a ratio of the angular position of the rotating member;
    calculate a turn number based on the cutoff value, the at least one selected sensor, and the angular position of the rotating member; and
    return an output value based on an output difference of a multiple of the turn number from the angular position of the rotating member.

11. The system of claim 10, wherein the sensor selection module is further configured to identify which sensor of the plurality of sensors is providing a highest output, and selecting the at least one sensor of the plurality of sensors based on a location of the at least one sensor of the plurality of sensors relative to the sensor determined to have the highest output.

12. The system of claim 10, wherein the multiple of the turn value is 4096.

13. The system of claim 10, wherein the output value represents the absolute angular rotation and the relative angular position of the rotating member.

14. The system of claim 10, wherein the calculation module is further configured to add a constant to the first difference.

15. The system of claim 10, wherein the plurality of sensors includes six sensors.

16. The system of claim 10, wherein the system is at least one of a field programmable gate array (FPGA), processor, and look up table (LUT).

17. The system of claim 10, wherein the calculation module is further configured to:
    compare the cutoff value to at least one range cutoff;
    determine a corresponding range thereof; and
    calculate the turn value based on the corresponding range determined.

18. The system of claim 17, wherein the calculation module is further configured to:
    calculate the turn value based on a location of a given sensor with a highest output relative to other sensors among the plurality of sensors.

* * * * *